United States Patent
Lin et al.

(10) Patent No.: US 8,258,588 B2
(45) Date of Patent: Sep. 4, 2012

(54) SEALING LAYER OF A FIELD EFFECT TRANSISTOR

(75) Inventors: Yu Chao Lin, Rende Township (TW); Jr Jung Lin, Wurih Township (TW); Yih-Ann Lin, Jhudong Township (TW); Jih-Jse Lin, Sijhih (TW); Chao-Cheng Chen, Shinchu (TW); Ryan Chia-Jen Chen, Chiayi (TW); Weng Chang, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 224 days.

(21) Appl. No.: 12/757,241

(22) Filed: Apr. 9, 2010

(65) Prior Publication Data

US 2011/0031562 A1   Feb. 10, 2011

Related U.S. Application Data

(60) Provisional application No. 61/232,226, filed on Aug. 7, 2009.

(51) Int. Cl.
*H01L 29/78* (2006.01)
*H01L 21/8234* (2006.01)
*H01L 21/8238* (2006.01)

(52) U.S. Cl. ............... 257/411; 257/410; 257/E29.255; 257/E21.626; 257/E21.64; 257/900

(58) Field of Classification Search .................. None
See application file for complete search history.

(56) References Cited

U.S. PATENT DOCUMENTS

| 7,223,664 | B2 * | 5/2007 | Ohta | 438/303 |
|---|---|---|---|---|
| 2006/0054979 | A1 * | 3/2006 | Kratzert et al. | 257/410 |
| 2006/0094177 | A1 * | 5/2006 | Ohta | 438/197 |
| 2007/0120204 | A1 * | 5/2007 | Yagishita | 257/410 |
| 2008/0076214 | A1 * | 3/2008 | Han et al. | 438/197 |
| 2008/0093660 | A1 * | 4/2008 | Park et al. | 257/324 |
| 2010/0044804 | A1 * | 2/2010 | Chen et al. | 257/410 |
| 2010/0244156 | A1 * | 9/2010 | Pal et al. | 257/410 |
| 2011/0147857 | A1 * | 6/2011 | Hirase et al. | 257/411 |
| 2011/0278651 | A1 * | 11/2011 | Thirupapuliyur et al. | 257/288 |

* cited by examiner

*Primary Examiner* — Victor A Mandala
(74) *Attorney, Agent, or Firm* — Lowe Hauptman Ham & Berner, LLP

(57) ABSTRACT

An exemplary structure for a gate structure of a field effect transistor comprises a gate electrode; a gate insulator under the gate electrode having footing regions on opposing sides of the gate electrode; and a sealing layer on sidewalls of the gate structure, wherein a thickness of lower portion of the sealing layer overlying the footing regions is less than a thickness of upper portion of the sealing layer on sidewalls of the gate electrode, whereby the field effect transistor made has almost no recess in the substrate surface.

20 Claims, 6 Drawing Sheets

SEALING LAYER OF A FIELD EFFECT TRANSISTOR

CROSS-REFERENCE TO RELATED APPLICATIONS

The present application claims priority of U.S. Provisional Patent Application Ser. No. 61/232,226 filed on Aug. 7, 2009 which is incorporated herein by reference in its entirety.

FIELD

This disclosure relates to integrated circuit fabrication, and more particularly to a field effect transistor with a sealing layer.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

FIG. 1 shows a cross-sectional view of a conventional sealing layer 112 for a field effect transistor 100 having a substrate recess 110. The field effect transistor 100 can be formed over a portion of the substrate 102. The field effect transistor 100 includes a gate structure 108 comprising a gate insulator 104 and a gate electrode 106 sequentially formed over the substrate 102, and the sealing layer 112 respectively formed on opposite sidewalls of the gate structure 108. However, problems arise when integrating the sealing layer 112 in a complementary metal-oxide-semiconductor (CMOS) process flow. For example, during the sealing layer 112 etching, a surface of the substrate 102 adjacent to the sealing layer 112 may be damaged and form a recess 110. Further, during subsequent implant processing, dopants distribution in active regions may be shifted. Thus, performance characteristics such as threshold voltage, capacitance overlay, and reliability may degrade.

Accordingly, what is needed is a sealing structure for a semiconductor device having no substrate recess.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
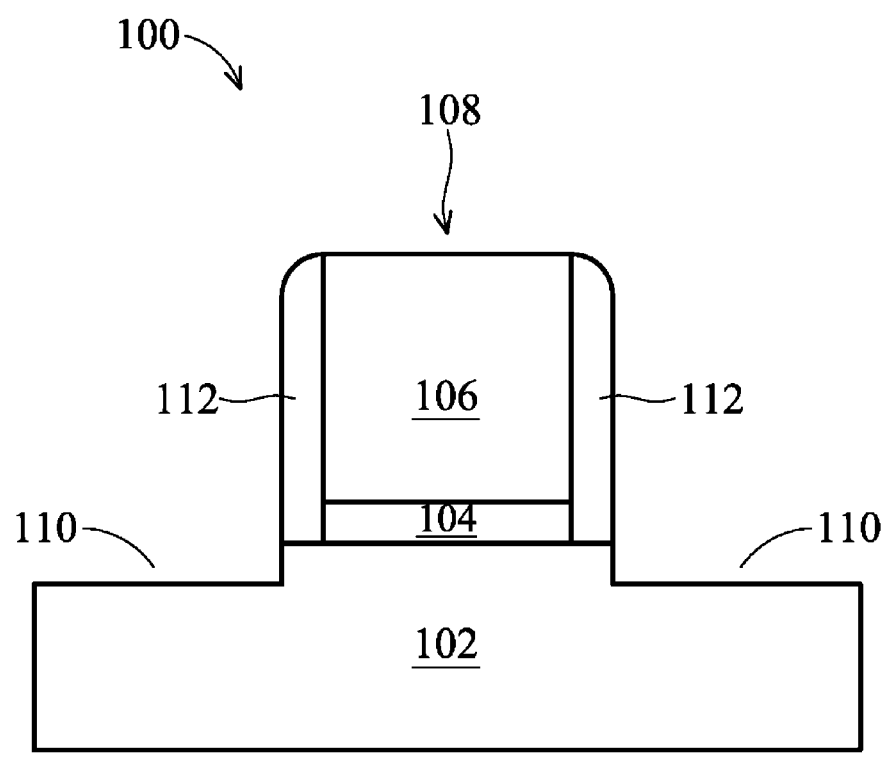
FIG. 1 shows a cross-sectional view of a conventional sealing layer for a field effect transistor having a substrate recess.

It is understood that the following disclosure provides many different embodiments, or examples, for implementing different features. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the purpose of simplicity and clarity.

Figure 2:
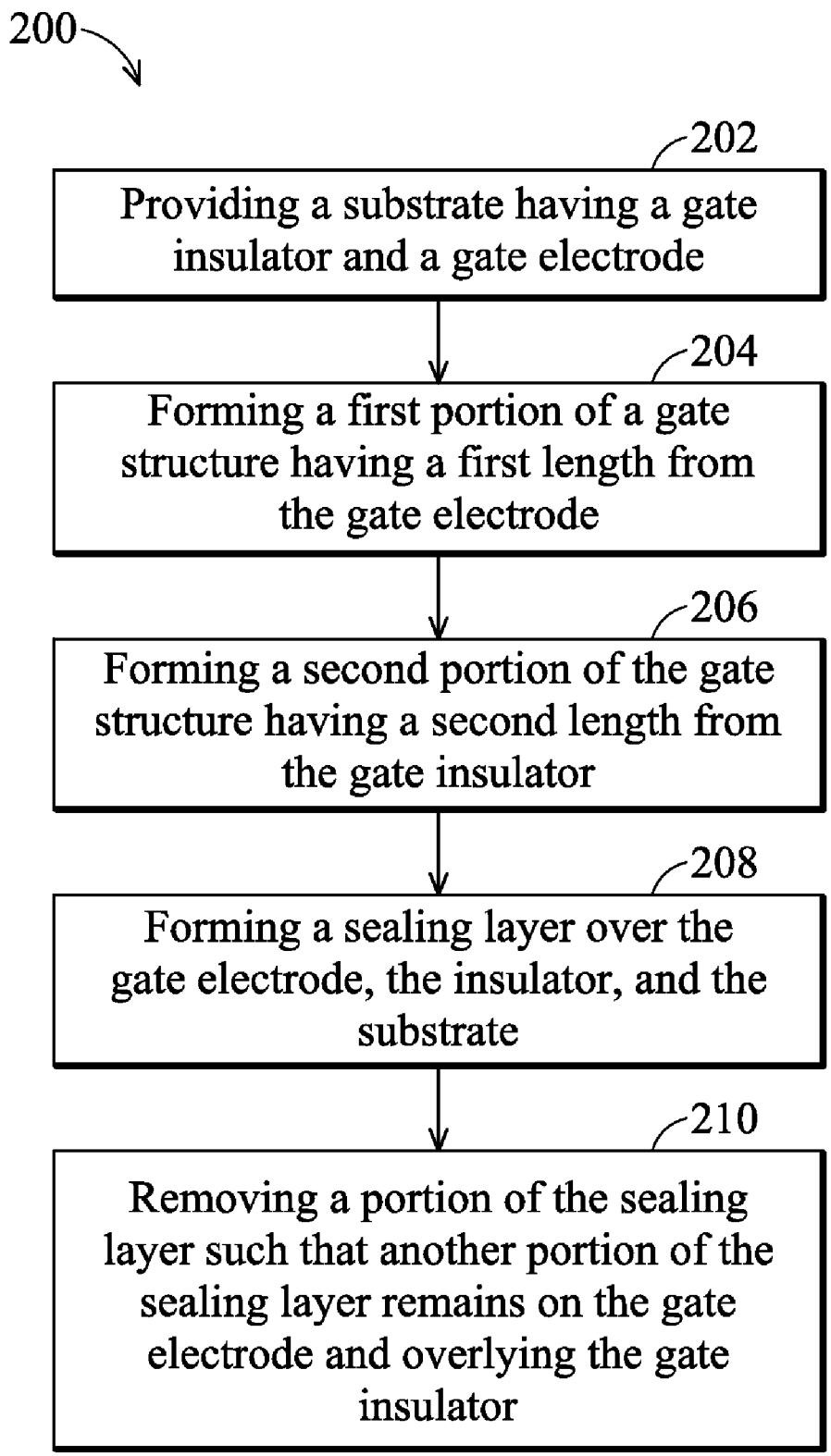
FIG. 2 is a flowchart illustrating a method for fabricating a field effect transistor having a sealing layer according to various aspects of the present disclosure.
Figure 3A:
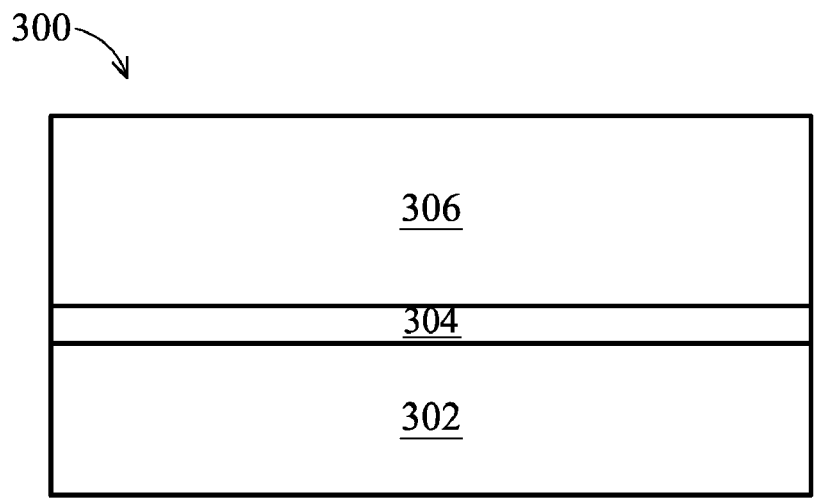
FIGS. 3A-E show schematic cross-sectional views of a field effect transistor having a sealing layer at various stages of fabrication according to an embodiment of the method of FIG. 2.
Figure 3B:
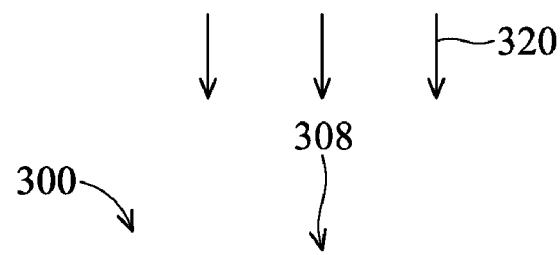
Figure 3C:
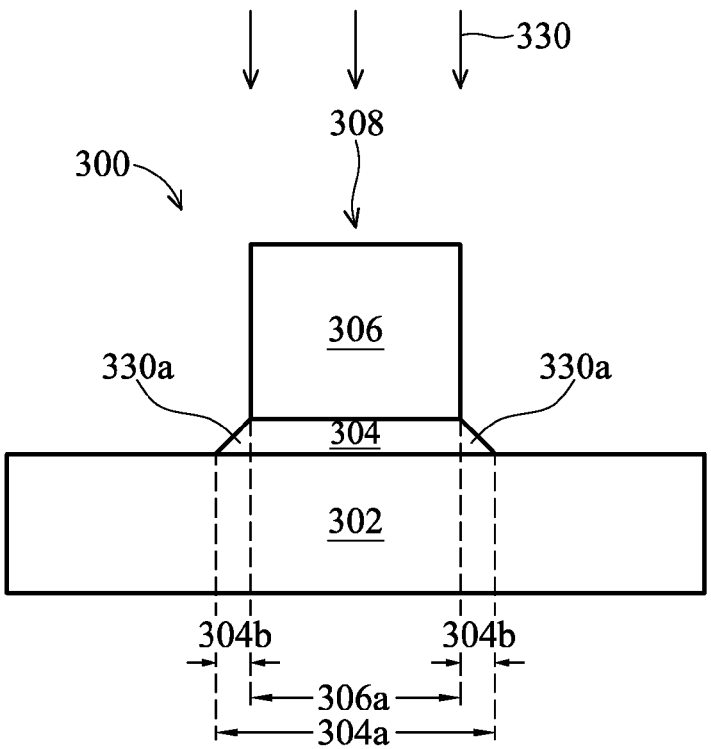
Figure 3D:
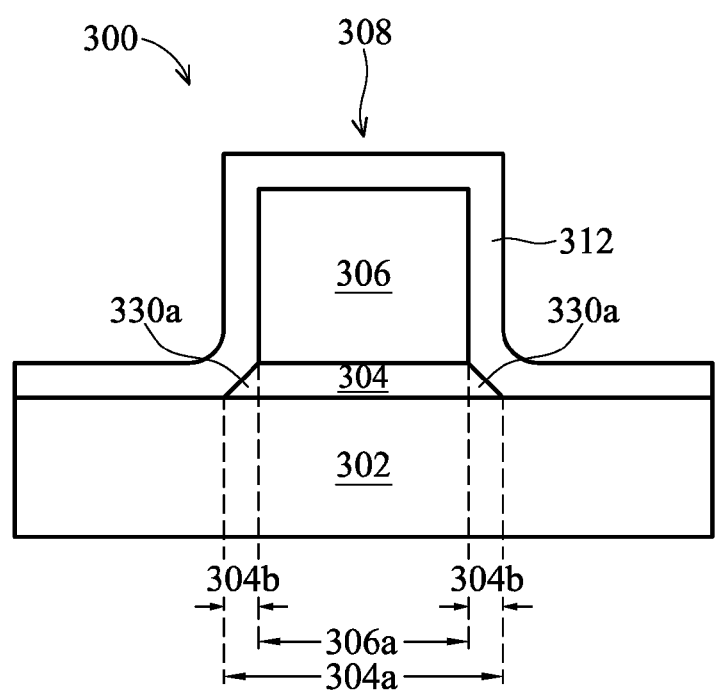
Figure 3E:
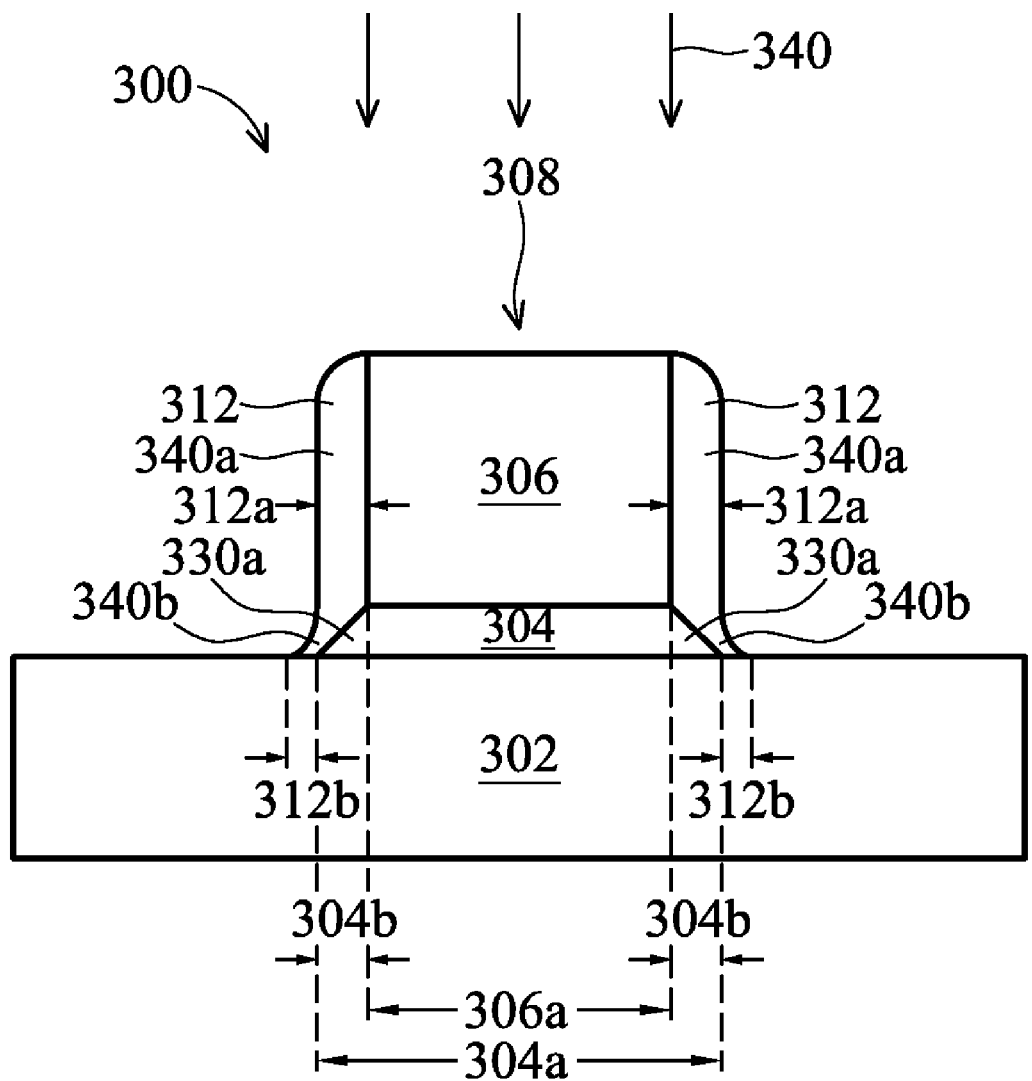

With reference to FIGS. 2 through 3E, a method 200 and a field effect transistor 300 are collectively described below. FIG. 2 is a flowchart illustrating a method for fabricating a field effect transistor 300 having a sealing layer according to various aspects of the present disclosure. FIGS. 3A-E show schematic cross-sectional views of a field effect transistor having a sealing layer at various stages of fabrication according to an embodiment of the method of FIG. 2. It is understood that part of the field effect transistor 300 may be fabricated with normal complementary metal-oxide-semiconductor (CMOS) technology processes, and thus some processes are briefly described herein. Also, FIGS. 2 through 3E are simplified for a better understanding of the concepts of the present disclosure. For example, although the figures illustrate a gate structure for the field effect transistor 300, it is understood the IC may include a number of various devices including resistors, capacitors, inductors, fuses, etc.

Referring to FIGS. 2 and 3A, the method 200 begins at step 202 in which a semiconductor substrate 302 having a gate insulator 304 and a gate electrode 306 formed thereon. The field effect transistor 300 may include a semiconductor substrate 302 such as a silicon substrate. The substrate 302 may alternatively include silicon germanium, gallium arsenic, or other suitable semiconductor materials. The substrate 302 may further include other features such as various doped regions, a buried layer, and/or an epitaxy layer. Furthermore, the substrate 302 may be a semiconductor on insulator such as silicon on insulator (SOI). In other embodiments, the semiconductor substrate 302 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The field effect transistor 300 may further include the gate insulator 304 over the substrate 302. In some embodiments, the gate insulator 304 may comprise silicon oxide, high-k dielectric material or combination thereof. The high-k dielectric material may comprise silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$—$Al_2O_3$) alloy, other suitable high-k dielectric materials, and/or combinations thereof. The gate insulator 304 may optionally comprise an interfacial layer (not shown) to reduce damages between the gate insulator 304 and the substrate 302. The interfacial layer may comprise silicon oxide having a thickness ranging from about 5 to about 10 angstroms formed on the substrate 302. The gate insulator 304 may be formed on the interfacial layer by atomic layer deposition (ALD) or other suitable technique. The gate insulator 304 may include a thickness ranging from about 10 to about 40 angstroms.

The field effect transistor 300 may further include a capping layer (not shown) for tuning a work function of a metal layer for properly performing as an N-type metal-oxide-semiconductor (NMOS) field effect transistor and a P-type MOS (PMOS) field effect transistor, respectively. For example, the capping layer may include lanthanum oxide, lanthanum silicon oxide, manganese oxide, aluminum oxide, or other suitable materials. The capping layer may be formed on or underneath the gate insulator 304.

The field effect transistor 300 may further include a gate electrode 306 formed over the gate insulator 304. The gate electrode 306 may include a thickness ranging from about 10 to about 200 angstroms. The gate electrode 306 may comprise poly-silicon or metal. The gate electrode 306 may comprise one or more layers including Al, AlTi, Ti, TiN, TaN, Ta, TaC, TaSiN, W, WN, MoN, MoON, $RuO_2$, poly-silicon, amorphous-silicon and/or other suitable materials. The gate electrode 306 may comprise one or more layers formed by chemical vapor deposition (CVD), physical vapor deposition (PVD or sputtering), plating, atomic layer deposition (ALD), and/or other suitable processes. The gate electrode 306 may be formed by a gate-first or a gate-last metal gate fabrication processes.

Referring to FIGS. 2 and 3B, the method 200 continues with step 204 in which a first portion of a gate structure 308 may be formed from the gate electrode 306, the first portion of the gate structure 308 having a first length 306a. In FIG. 2B, the field effect transistor 300 may further include a hard mask (not shown) formed over the gate electrode layer 306. The hard mask may be formed by a deposition process or other suitable process. The hard mask may include silicon nitride, silicon oxynitride, silicon carbide, or other suitable material. A patterned photo-sensitive layer (not shown) may be formed by a photolithography process for gate patterning. The photolithography process may include spin coating, soft-baking, exposure, post-baking, developing, rinsing, drying, and other suitable process. Alternatively, the gate patterning may be performed by an immersion lithography, electron beam lithography, or other suitable process.

A first etch process 320 may be performed to pattern the hard mask, and the hard mask may be used to pattern the gate electrode 306 to form the first portion of a gate structure 308. The first etch process 320 may have a high selectivity such that the first etch process 320 may stop at the gate insulator 304. For example, the first etch process 320 may be performed under a source power of about 750 to 900 W, a bias power of about 450 to 550 W, and a pressure of about 1 to 2 mTorr, using Cl2, HBr and N2 as etching gases. The patterned photo-sensitive layer and hard mask may be removed by stripping or other suitable process.

Accordingly, the gate structure 308 may include the gate electrode layer 306 having the first length 306a measured along a length between opposite sidewalls of the gate electrode 306. The length 306a may depend on the process technology (e.g., 45 nm, 32 nm, 28 nm, and below).

Referring to FIGS. 2 and 3C, the method 200 continues with step 206 in which a second portion of the gate structure 308 may be formed from the gate insulator 304 using the gate electrode 306 as a mask, the second portion of the gate structure 308 having a second length 304a greater than the first length 306a of the gate electrode layer 206. In FIG. 3C, a second etch process 330 such as a dry etch may be performed to remove the unprotected gate insulator 304 using the gate electrode 306 as a protective mask. The second etch process 330 may have a high selectivity such that the etch process may stop at the semiconductor substrate 302. Furthermore, it is preferred to form extended footing regions 330a having a sloped profile on opposite sides of the gate insulator 304 over the substrate 302 during the second etch process 330. The footing regions 330a are portions of the gate insulator 304 that extend below the gate electrode 306. The sloped extended footing regions 330a may function as a buffer to prevent damage to the gate insulator 304 within a channel region. For example, the second etch process 330 may comprise 3 etch steps. A first etch step of the second etch process 330 may be performed under a source power of about 450 to 550 W, and a pressure of about 1 to 2 mTorr, using Cl2 and BCl3 as etching gases. Next, a second etch step of the second etch process 330 may be performed under a source power of about 500 to 650 W, and a pressure of about 6 to 8 mTorr, using BP, O2 and Ar as etching gases. And then, a third etch step of the second etch process 330 may be performed under a source power of about 450 to 550 W, and a pressure of about 1 to 2 mTorr, using Cl2 and BCl3 as etching gases.

Still referring to FIG. 3C, following the second etch process 330, the gate structure 308 may further include the gate insulator 304 having extended footing regions 330a that extends from one of the sidewalls of the gate electrode 306 to an outer edge of the gate insulator 304 and from the other one of the sidewalls of the gate electrode 306 to the other outer edge of the gate insulator 304. The extended footing regions 330a may have a third length 304b measured from one of the sidewalls of the gate electrode 306 to the outer edge of the gate insulator 304 or from the other one of the sidewalls of the gate electrode 306 to the other outer edge of the gate insulator 304. The third length 304b of the footing regions 330a of the gate insulator 304 has an average length ranging from 25 to 60 angstroms. Accordingly, length difference between the second length 304a of the gate insulator 304 and the first length 306a of the gate electrode 306 is about 2 times of the third length 304b of the extended footing regions 330a.

Referring to FIGS. 2 and 3D, the method 200 continues with step 208 in which a sealing layer 312 may be formed over the sidewalls of the gate structure 308 comprising the gate electrode 306 and the gate insulator 304, and the semiconductor substrate 302. In FIG. 3D, the sealing layer 312 may be formed over the sidewalls of the gate structure 308 and the semiconductor substrate 302 by CVD or other suitable deposition process. The sealing layer 312 comprises a material selected from the group of silicon oxide, silicon nitride, silicon oxynitride, and silicon-rich oxide. Alternatively, the sealing layer 312 may include an oxygen gettering material such as a metal or alloy or compound or dielectric comprising Ti, Ta, Zr, Hf, W, Mo, and/or combinations thereof. The sealing layer 312 may include a single layer or multiple layers configuration. For example, the sealing layer 312 may include an oxygen gettering metal layer and a layer including silicon-rich dielectric and/or nitrogen containing dielectric.

Referring to FIGS. 2 and 3E, the method 200 continues with step 210 in which a third etching process 340 such as a dry etching technique (e.g., anisotropic etching) may be performed on the sealing layer 312 to remove a portion of the sealing layer 312 such that another portion of the sealing layer 312 remains on the opposite sidewalls of the gate electrode 306 and overlying the footing regions 330a of the gate insulator 304. It should be noted that the sealing layer 312 may function to prevent exposure of the gate structure 308 to protect the gate structure 308 from damage or loss during subsequent processing. For example, the third etch process 340 may comprise 3 etch steps. A first etch step of the third etch process 340 may be performed under a source power of about 900 to 1100 W, and a pressure of about 8 to 12 mTorr, using BP and O2 as etching gases. Next, a second etch step of the third etch process 340 may be performed under a source power of about 150 to 180 W, and a pressure of about 10 to 15 mTorr, using BP, CH2F2, O2, He, and Ar as etching gases. And then, a third etch step of the third etch process 340 may be performed under a source power of about 180 to 220 W, and a pressure of about 35 to 45 mTorr, using BP, CH3F, O2 and He as etching gases. In this way, the sealing structure 312 for the semiconductor device 300 is formed with almost no recess in the substrate surface.

Still referring to FIG. 3E, following the third etch process 340, the sealing layer 312 may be on the opposite sidewalls of the gate structure 308. A thickness of the sealing layer 312 remains on the opposite sidewalls of the gate electrode 306 and overlying the footing regions 330a of the gate insulator 304 may depend on the extended footing regions 330a of the gate insulator 304. In other word, the thickness of the sealing layer 312 remaining on the opposite sidewalls of the gate electrode 306 and overlying the footing regions 330a of the gate insulator 304 may comprise a non-uniform configuration, it is preferred that the thickness of lower portion 340b (TB) of the sealing layer 312 overlying the footing regions 330a of the gate insulator 304 is less than the thickness of upper portion 340a (TU) of the sealing layer 312 on the opposite sidewalls of the gate electrode 306. In one embodiment, the maximum thickness 312a of the upper portion 340a (TU) of the sealing layer 312 may be in the range of about 50 to 80 angstroms. The minimum thickness 312b of the lower portion 340b (TB) of the sealing layer 312 may be in the range of about 25 to 60 angstroms. In other embodiment, the ratio of the minimum thickness 312b of lower portion 340b (TB) to maximum thickness 312a of the upper portion 340a (TU) of the sealing layer 312 is from 0.5 to 0.9. In another embodiment, a sum (TS) of the third length 304b of the extended footing regions 330a of the gate insulator 304 and the minimum thickness 312b of the lower portion 340b of the sealing layer 312 is larger than the maximum thickness 312a of the upper portion 340a (TU) of the sealing layer 312. The difference between TS and TU is about 5 to 10 angstroms.

Figure 4:
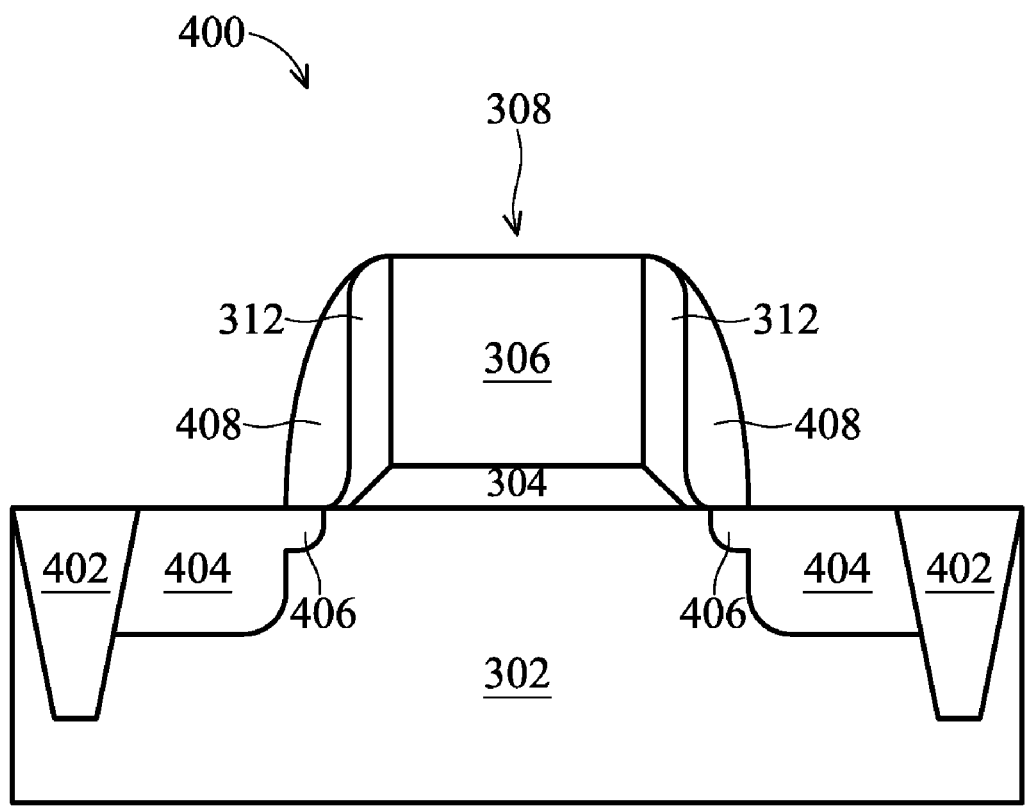
FIG. 4 is a cross-sectional view of a field effect transistor having a sealing layer fabricated using the steps shown in FIG. 3A-E.

Referring to FIG. 4, illustrated a cross-sectional view of a field effect transistor 400 having the sealing layer 312 fabricated using the steps shown in FIG. 3A-E. The field effect transistor 400 may be similar to the field effect transistor 300 of FIG. 3 except for the differences discussed below. Similar features in FIGS. 3 and 4 are numbered the same for the sake of simplicity and clarity. The field effect transistor 400 such as a metal-oxide-semiconductor (MOS) transistor can be formed over an active region of the substrate 302 adjacent to an isolation structure 402. Fabrication of the field effect transistor 400 is well known to those skilled in the art and is thus not described here, for brevity. The field effect transistor 400 now includes the gate structure 308 comprising the gate electrode 306 and the gate insulator 304 under the gate electrode 306 having footing regions on opposing sides of the gate electrode 306, and the sealing layer 312 and gate spacers 408 sequentially formed on opposite sidewalls of the gate structure 308. The field effect transistor 400 also includes source/drain regions 404 and lightly doped source/drain regions 406 on opposite sides of the gate structure 308 formed in the active region of the substrate 302. Then, subsequent processes, including interconnect processing, must be performed after forming the field effect transistor 400 to complete the IC fabrication.

While the preferred embodiments have been described by way of example, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements. The disclosure can be used to form or fabricate a sealing layer for a field effect transistor. In this way, a sealing layer for a field effect transistor is formed with almost no recess in the substrate surface.

What is claimed is:

1. A gate structure of a field effect transistor comprising:
a gate electrode;
a gate insulator under the gate electrode and having footing regions on opposing sides of the gate electrode; and
a sealing layer on sidewalls of the gate structure, wherein
a thickness of a lower portion of the sealing layer overlying the footing regions is less than a thickness of an upper portion of the sealing layer on sidewalls of the gate electrode, and
a sum of a length of each footing region and a minimum thickness of the lower portion of the sealing layer is larger than a maximum thickness of the upper portion of the sealing layer.

2. The gate structure of claim 1, wherein the sealing layer comprises a material selected from the group consisting of silicon oxide, silicon nitride, silicon oxynitride, and silicon-rich oxide.

3. The gate structure of claim 1, wherein a ratio of the minimum thickness of the lower portion to the maximum thickness of the upper portion of the sealing layer is from 0.5 to 0.9.

4. The gate structure of claim 1, wherein the maximum thickness of the upper portion of the sealing layer is in a range of between about 50 angstroms and 80 angstroms.

5. The gate structure of claim 1, wherein the minimum thickness of the lower portion of the sealing layer is in a range of between about 25 angstroms and 60 angstroms.

6. The gate structure of claim 1, wherein the gate insulator comprises a high-k dielectric material.

7. The gate structure of claim 1, wherein the footing regions of the gate insulator have an average length ranging from 25 angstroms to 60 angstroms.

8. The gate structure of claim 1, wherein a difference between (a) the sum of the length of each footing region and the minimum thickness of the lower portion of the sealing layer and (b) the maximum thickness of the upper portion of the sealing layer is between about 5 angstroms and 10 angstroms.

9. The gate structure of claim 1, wherein the gate electrode comprises poly-silicon or metal.

10. The gate structure of claim 1, wherein the sealing layer comprises an oxygen gettering material including metal, alloy, compound, or dielectric comprising one or combinations of Ti, Ta, Zr, Hf, W, and Mo.

11. A field effect transistor comprising:
a substrate comprising an active region;
a gate structure comprising
   a gate electrode, and
   a gate insulator under the gate electrode and having footing regions on opposing sides of the gate electrode;
a sealing layer on sidewalls of the gate structure, wherein a thickness of a lower portion of the sealing layer overlying the footing regions is less than a thickness of an upper portion of the sealing layer on sidewalls of the gate electrode; and
source and drain regions in the active region on opposite sides of the gate structure, wherein
a sum of a length of each footing region and a minimum thickness of the lower portion of the sealing layer is larger than a maximum thickness of the upper portion of the sealing layer.

12. The field effect transistor of claim 11, wherein the sealing layer comprises a material selected from the group consisting of silicon oxide, silicon nitride, silicon oxynitride, and silicon-rich oxide.

13. The field effect transistor of claim 11, wherein a ratio of the minimum thickness of the lower portion to the maximum thickness of the upper portion of the sealing layer is between from 0.5 to 0.9.

14. The field effect transistor of claim 11, wherein the maximum thickness of the upper portion of the sealing layer is in a range of between about 50 angstroms and 80 angstroms.

15. The field effect transistor of claim 11, wherein the minimum thickness of the lower portion of the sealing layer is in a range of between about 25 angstroms and 60 angstroms.

16. The field effect transistor of claim 11, wherein the gate insulator comprises a high-k dielectric material.

17. The field effect transistor of claim 11, wherein the footing regions of the gate insulator have an average length ranging from 25 angstroms to 60 angstroms.

18. The field effect transistor of claim 11, wherein a difference between (a) the sum of the length of the footing region and the minimum thickness of the lower portion of the sealing layer and (b) the maximum thickness of the upper portion of the sealing layer is about 5 angstroms to 10 angstroms.

19. The field effect transistor of claim 11, wherein the gate electrode comprises poly-silicon or metal.

20. The field effect transistor of claim 11, wherein the sealing layer comprises an oxygen gettering material including metal, alloy, compound, or dielectric comprising one or combinations of Ti, Ta, Zr, Hf, W, and Mo.

* * * * *